(12) United States Patent
Kobayashi (10) Patent No.: US 9,510,490 B2
(45) Date of Patent: Nov. 29, 2016

(54) ELECTRONIC DEVICE (71) Applicant: SHINKO ELECTRIC INDUSTRIES CO., LTD., Nagano-shi, Nagano (JP)

(72) Inventor: Tomoki Kobayashi, Nagano (JP)

(73) Assignee: SHINKO ELECTRIC INDUSTRIES CO., LTD., Nagano-shi, Nagano (JP)

( * ) Notice: Subject to any disclaimer, the term of this patent is extended or adjusted under 35 U.S.C. 154(b) by 311 days.

(21) Appl. No.: 14/190,640

(22) Filed: Feb. 26, 2014

(65) Prior Publication Data
US 2014/0240936 A1 Aug. 28, 2014

(30) Foreign Application Priority Data

Feb. 27, 2013 (JP) ................................. 2013-037549

(51) Int. Cl.
*H05K 9/00* (2006.01)
*H05K 1/02* (2006.01)

(52) U.S. Cl.
CPC .......... *H05K 9/0075* (2013.01); *H05K 1/0233* (2013.01); *H01L 2224/48091* (2013.01); *H05K 1/0243* (2013.01); *H05K 2201/0317* (2013.01); *H05K 2201/0338* (2013.01); *H05K 2201/086* (2013.01); *H05K 2201/10098* (2013.01); *H05K 2203/095* (2013.01); *H05K 2203/1476* (2013.01)

(58) Field of Classification Search
CPC .... H05K 9/00; H05K 9/0075; H05K 1/0233; H05K 1/0243; H05K 2224/48091; H05K 2201/0317

USPC ........................................................ 361/760
See application file for complete search history.

(56) References Cited

U.S. PATENT DOCUMENTS

| 2002/0074144 A1* | 6/2002 | Watanabe | ............. H01L 23/552 174/394 |
| 2007/0218273 A1* | 9/2007 | Ikeda | ..................... B82Y 25/00 428/323 |
| 2008/0081161 A1* | 4/2008 | Tomita | .................. H01L 23/145 428/209 |

FOREIGN PATENT DOCUMENTS

WO WO-2005/081609 A1 9/2005

* cited by examiner

*Primary Examiner* — Eric Thomas
*Assistant Examiner* — Michael P McFadden
(74) *Attorney, Agent, or Firm* — Drinker Biddle & Reath LLP (57) ABSTRACT

There is provided an electronic device. The electronic device includes: a wiring board; a first electronic component mounted on the wiring board and configured to emit an electromagnetic wave having a first frequency band; a second electronic component mounted on the wiring board and configured to emit an electromagnetic wave having a second frequency band; a first magnetic thin film covering the wiring board, the first electronic component and the second electronic component, wherein the first magnetic thin film has a composition corresponding to the first frequency band; and a second magnetic thin film covering the first magnetic thin film, wherein the second magnetic thin film has a composition corresponding to the second frequency band.

7 Claims, 7 Drawing Sheets

ELECTRONIC DEVICE

This application claims priority from Japanese Patent Application No. 2013-037549, filed on Feb. 27, 2013, the entire contents of which are herein incorporated by reference.

BACKGROUND OF THE INVENTION

1. Technical Field

The present disclosure relates to an electronic device.

2. Description of the Related Art

An electronic device including a plurality of electronic components which are mounted on a wiring board has been known. The electronic components are configured to emit electromagnetic waves according to their operations. In addition, the electronic components are affected by electromagnetic waves coming from the outside. As a method for preventing release and penetration of the electromagnetic waves, it can be considered, for example, to form a ferrite film or the like, to fix a shield case made of metal to the wiring board (see WO2005/081609, for example).

By the way, in some cases, the electronic components for various kinds of electronic circuits are mounted on the wiring board. Therefore, it is desired to suppress influences of electromagnetic waves emitted from the various kinds of electronic circuits.

SUMMARY OF THE INVENTION

According to one or more aspects of the present invention, there is provided an electronic device. The electronic device includes: a wiring board; a first electronic component mounted on the wiring board and configured to emit an electromagnetic wave having a first frequency band; a second electronic component mounted on the wiring board and configured to emit an electromagnetic wave having a second frequency band; a first magnetic thin film covering the wiring board, the first electronic component and the second electronic component, wherein the first magnetic thin film has a composition corresponding to the first frequency band; and a second magnetic thin film covering the first magnetic thin film, wherein the second magnetic thin film has a composition corresponding to the second frequency band.

According to one aspect of the invention, it is possible to suppress influences of the electromagnetic waves on the electronic components which are mounted on the wiring board.

DETAILED DESCRIPTION

Embodiments of the invention will be now described referring to the attached drawings.

It should be noted that the attached drawings are shown in a partially enlarged scale, in some cases, and sizes, ratios, etc. in the drawings are sometimes different from actual ones. Moreover, in the sectional views, hatchings are partly omitted for better understanding of sectional structures of respective members.

First Embodiment

Figure 1A:
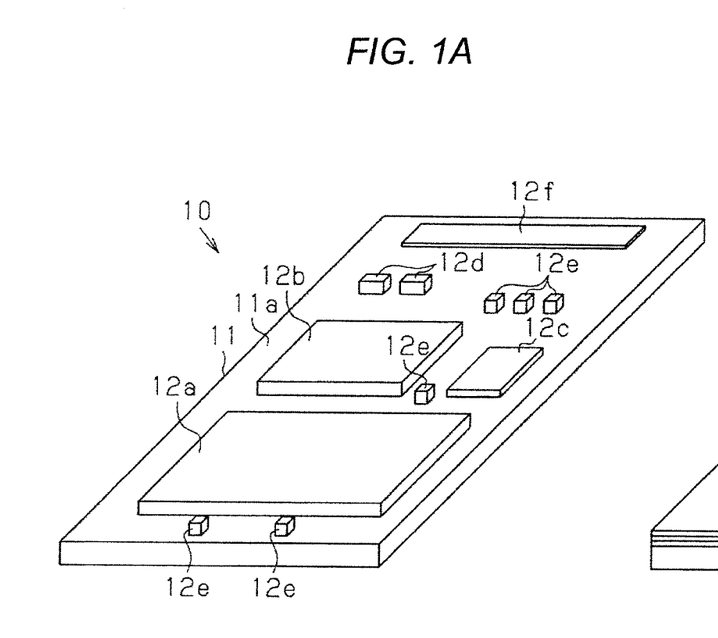
FIG. 1A and FIG. 1B are schematic perspective views of an electronic device according to a first embodiment of the present invention.

As shown in FIG. 1A, a plurality of electronic components 12a to 12f are mounted on one main face 11a of a wiring board 11 of an electronic device 10. The electronic components 12a to 12e are connected to pads (not shown) on the wiring board 11. The electronic components 12a to 12c are, for example, semiconductor integrated circuits (LSI). For example, the electronic components 12d, 12e are resistors, condensers or coils. The electronic component 12f is an antenna to be used for wireless communication, for example. This electronic component 12f is, for example, a wiring pattern on the one main face 11a of the wiring board 11.

Figure 1B:
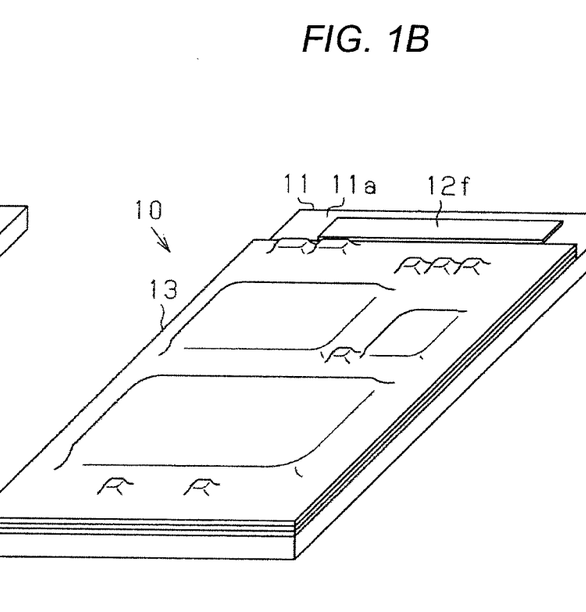

As shown in FIG. 1B, a portion of the one main face 11a of the wiring board 11 and the electronic components 12a to 12e are covered with a magnetic film 13. The magnetic film 13 is configured to shield or attenuate electromagnetic waves at frequencies corresponding to the electronic components 12a to 12e which are mounted on the wiring board 11. Thus, the magnetic film 13 reduces an amount of the electromagnetic waves, which are generated by operations of the electronic components 12a to 12e and irradiated to the outside. Moreover, the magnetic film 13 reduces an amount of the electromagnetic waves, which come from the outside and affect the electronic components 12a to 12e, that is, an amount of the electromagnetic waves reaching the electronic circuit, as compared with a case where the magnetic film 13 is not used.

Moreover, the magnetic film 13 shields or attenuates the electromagnetic waves. Therefore, the electronic component 12f which serves as the antenna for the wireless communication is not covered with the magnetic film 13.

Then, an example of the electronic device will be now described. In the following description, parts of the elements as shown in FIGS. 1A and 1B are denoted with the same reference numerals.

Figure 2:
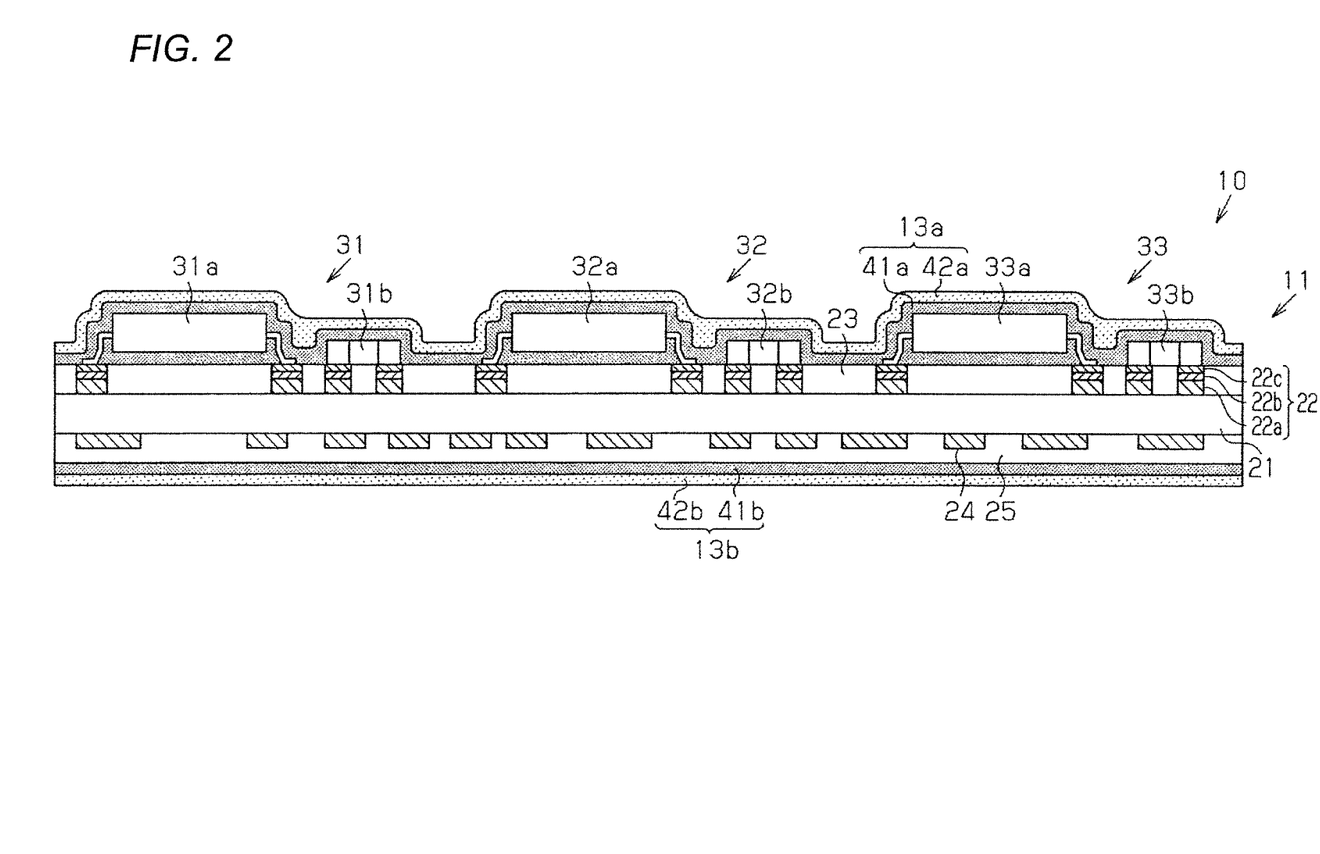
FIG. 2 is a schematic sectional view of the electronic device according to the first embodiment.

As shown in FIG. 2, the wiring board 11 of the electronic device 10 has a board body 21. Material for the board body 21 is, insulating resin such as glass epoxy resin, ceramics, silicone, or pre-preg material, for example. Moreover, the board body 21 may be formed as a multi-layered wiring board.

Mounting pads 22 are formed on a first main face (an upper face in FIG. 2) of the board body 21. Each of the mounting pads 22 includes a plurality of (three in FIG. 2) metal layers 22a to 22c, which are formed in this order on the first main face of the board body 21. The metal layer 22a is made of copper, for example. The metal layer 22b is made of nickel (Ni), for example. The metal layer 22c is made of gold (Au), for example. The metal layer 22a is a part of a wiring pattern which is formed on the first main face of the board body 21, and is exposed from an opening which is formed in a solder resist 23 covering this wiring pattern and the first main face of the wiring board 21. The metal layers 22b, 22c are plating layers which are formed on an upper face of the metal layer 22a. In FIG. 2, parts of the wiring pattern except the mounting pads 22 (a region covered with the solder resist 23) are not shown. The solder resist 23 is resin such as epoxy, polyester or the like. The number of the metal layers in the mounting pad 22 may be appropriately changed. Moreover, palladium (Pd), silver (Ag), Pd alloy, Au alloy, Ni alloy, Ag alloy, etc. may be used as the material for the metal layers 22b and 22c.

A wiring pattern 24 is formed on a second main face (a lower face in FIG. 2) of the board body 21. The wiring pattern 24 is electrically connected to the wiring pattern which is formed on the first main face through via holes (not shown). The via holes are through-hole via holes or stack via holes. This wiring pattern 24 and the second main face of the board body 21 are covered with a solder resist 25. The wiring pattern 24 is formed of copper, for example. The solder resist 25 is resin such as epoxy, polyester, for example.

The electronic device 10 includes a power supply circuit 31, a control circuit 32, and a high frequency circuit 33. The power supply circuit 31 includes a semiconductor device 31a and a chip component 31b which are mounted on the wiring board 11. The semiconductor device 31a and the single chip component 31b in the power supply circuit 31 are shown as a single one in FIG. 2. A package shape of the semiconductor device 31a is QFP, for example, and leads of the semiconductor device 31a are connected to the mounting pads 22 by soldering (not shown). The chip component 31b is, for example, a resistor, a condenser, a coil, a diode or the like, and connected to the mounting pad 22 by soldering (not shown).

Similarly, the control circuit 32 includes a semiconductor device 32a and a chip component 32b which are mounted on the wiring board 11. Moreover, the high frequency circuit 33 includes a semiconductor device 33a and a chip component 33b which are mounted on the wiring board 11. Single semiconductor devices 32a, 33a and single chip components 32b, 33b which are included in the control circuit 32 and the high frequency circuit 33 are shown in FIG. 2.

Package shapes of the semiconductor devices 31a to 33a as shown in FIG. 2 may be, for example, DIP, SOP, BGA and so on. Moreover, passive elements such as the resistor and condenser may be formed as the components having leads.

The power supply circuit 31 includes, for example, a DC-DC converter, and generates power supply voltage to be supplied to the high frequency circuit 33. The control circuit 32 includes, for example, a CPU, and a signal generating circuit which generates clock signals for operating the circuit sections 31 to 33, and controls the power supply circuit 31 and the high frequency circuit 33. The high frequency circuit 33 includes, for example, a receiving circuit and a transmitting circuit for wireless communication.

A magnetic film 13a is formed on the upper face of the wiring board 11. The respective semiconductor devices 31a to 33a and the chip components 31b to 33b are covered with the magnetic film 13a. The magnetic film 13a includes a plurality of layers (two layers in FIG. 2) of magnetic thin films 41a, 42a. The magnetic thin film 41a is formed to cover the upper face of the wiring board 11, surfaces of the semiconductor devices 31a to 33a, and surfaces of the chip components 31b to 33b. The magnetic thin film 42a is formed to cover a surface of the magnetic thin film 41a.

Although the magnetic thin films 41a, 42a are shown, in FIG. 2, as having larger thicknesses than their actual thicknesses for easy understanding, the actual thicknesses of the magnetic thin films 41a, 42a are 1 to 3 μm, for example. Therefore, the magnetic thin film 41a and the magnetic thin film 42a are present between the semiconductor device 31a and the chip component 31b of the power supply circuit 31 and between the semiconductor device 32a and the chip component 32b of the control circuit 32, in a direction along the surface of the wiring board 11. Also, the magnetic thin film 41a and the magnetic thin film 42a are present between the semiconductor device 32a and the chip component 32b of the control circuit 32 and between the semiconductor device 33a and the chip component 33b of the high frequency circuit 33, in the direction along the surface of the wiring board 11.

A magnetic film 13b which covers the lower face of the wiring board 11 includes magnetic thin films 41b, 42b. These magnetic thin films 41b, 42b are formed in this order on the lower face of the wiring board 11. A thickness of the magnetic thin films 41b, 42b is 1 to 3 μm, for example.

The magnetic thin films 41a, 41b are formed of ferrite containing nickel (Ni) and zinc (Zn), for example, which are sometimes called as Ni—Zn ferrite films, in the following description. The magnetic thin films 42a, 42b are formed of ferrite containing manganese (Mn) and zinc (Zn), for example, which are sometimes called as Mn—Zn ferrite films, in the following description.

In this embodiment, types and ratios of the metals which are contained in the magnetic thin films 41a, 42a, 41b, 42b are determined according to the circuits 31 to 33. Composition of the magnetic thin films 41a, 41b (the Ni—Zn ferrite film) is determined according to the control circuit 32 and the high frequency circuit 33. Composition of the magnetic thin films 42a, 42b (the Mn—Zn ferrite film) is determined according to the power supply circuit 31 and the high frequency circuit 33.

The magnetic thin films 41a, 41b, 42a, 42b are formed, for example, by spin spraying method. Therefore, the magnetic thin film 41a is formed to fill gaps between the semiconductor devices 31a to 33a and the wiring board 11.

Plasma treatment is performed after the magnetic thin film 41a is formed, and then the magnetic thin film 42a is formed after this plasma treatment. In the plasma treatment, an OH radical is provided on a surface of the magnetic thin film 41a. Metal ion contained in a reaction solution which is used in the spin spraying method is coupled to the OH radical on the surface of the magnetic thin film 42a. In this manner, high adhesion can be obtained between the magnetic thin film 41a and the magnetic thin film 42a. In the same manner, plasma treatment is performed after the magnetic thin film 41b is formed, and then the magnetic thin film 42b is formed after this plasma treatment. In this manner, high adhesion can be obtained between the magnetic thin film 41b and the magnetic thin film 42b. The plasma treatment may be performed before the magnetic thin films 41a, 41b are formed. In this case, the OH radical is provided on an exposed face of the wiring board 11, the surfaces of the semiconductor devices 31a to 33a and surfaces of the chip components 31b to 33b during the plasma treatment. Thus, it is possible to enhance the adhesion of the magnetic thin films 41a, 41b.

Complex permeability μ of the magnetic material (ferrite) which is energized by alternating current is represented by a formula $\mu = \mu' - j\mu''$.

An imaginary part $\mu''$ is a magnetic loss part which is necessary for absorbing electromagnetic waves. The magnetic material converts the electromagnetic waves in a frequency band corresponding to a resonance frequency into thermal energy due to magnetic loss property. The resonance frequency of ferrite corresponds to composition of ferrite. Therefore, it is possible to adjust the resonance frequency to a desired value, by appropriately changing the composition of ferrite. Then, by using ferrite having this composition, it is possible to decrease the intensity of the electromagnetic waves passing through ferrite in a frequency band corresponding to the resonance frequency.

Basic composition of ferrite is $M.Fe_3O_4$, where M is a bivalent metal ion. Ferrite of this type is called as spinel ferrite. The bivalent metal ion includes, for example, manganese (Mn), zinc (Zn), nickel (Ni), magnesium (Mg), cobalt (Co), and copper (Cu). The properties of ferrite depend on types and ratios of at least one kind of metal ions which are contained in M.

For example, ferrite (Zn ferrite) containing zinc (Zn) is an anti-ferro-magnetic material, and does not have ferro-magnetic property. However, when zinc is added to ferrite containing other metals, polygenetic ferrite is composed and the magnetism is enhanced (saturated magnetic flux density is increased). Moreover, when zinc (ZN) is added, ferrite is soft magnetized.

The complex permeability and resonance frequency of ferrite vary according to added content of zinc (Zn) or cobalt (Co). For example, by increasing the content of zinc, the complex permeability is enhanced, and the resonance frequency of the complex permeability is lowered. On the other hand, by decreasing the content of zinc, the complex permeability is lowered, and the resonance frequency of the complex permeability is enhanced. Moreover, by increasing the content of cobalt, the complex permeability is enhanced, and the resonance frequency of the complex permeability is enhanced.

Figure 3:
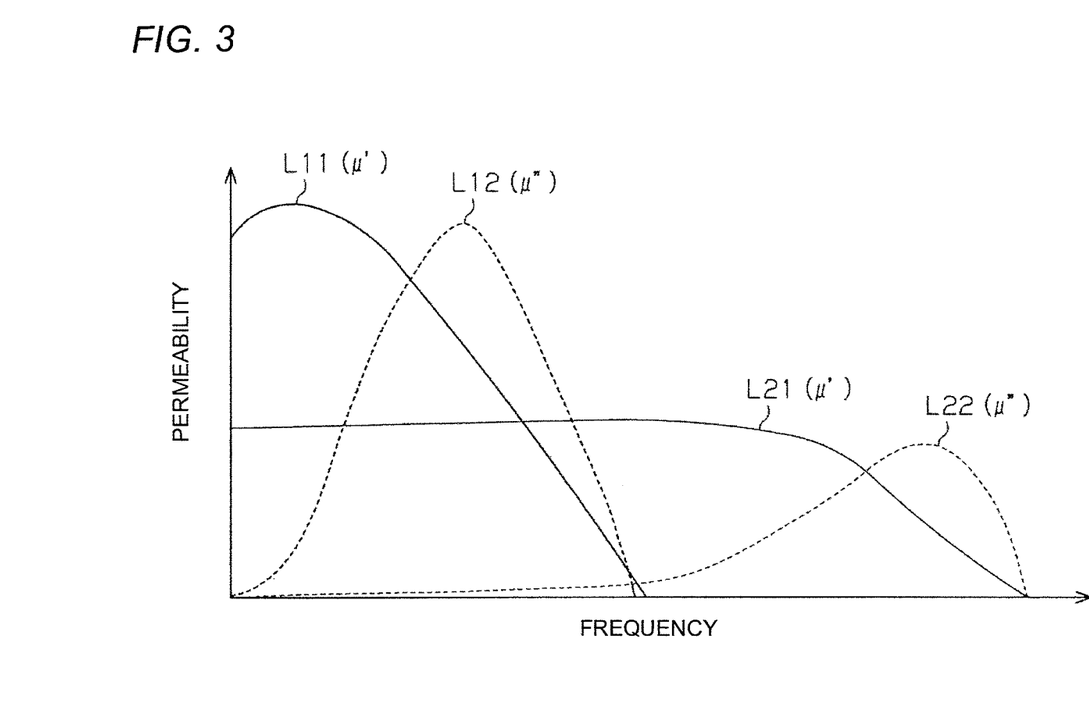
FIG. 3 is a graph showing properties of magnetic thin films.

FIG. 3 shows an example of frequency characteristics of complex permeability of the Ni—Zn ferrite film and the Mn—Zn ferrite film. In FIG. 3, a solid line L11 represents a real part $\mu'$ of the complex permeability of the Mn—Zn ferrite film, and a dotted line L12 represents an imaginary part $\mu''$ of the complex permeability of the Mn—Zn ferrite film. Moreover, a solid line L21 represents a real part $\mu'$ of the complex permeability of the Ni—Zn ferrite film, and a dotted line L22 represents an imaginary part $\mu''$ of the complex permeability of the Ni—Zn ferrite film.

For example, the resonance frequency of the Ni—Zn ferrite film is several GHz. Moreover, the Ni—Zn ferrite film has resistivity of about $1 \times 10^6$ ($\Omega \cdot m$), and can be treated as an electrical insulator. For example, the resonance frequency of the Mn—Zn-ferrite film is several MHz, and its resistivity is about 1 to 10 ($\Omega \cdot m$).

Now, the operation of the electronic device 10 will be now described.

In this embodiment, the control circuit 32 includes logic circuits such as a CPU, as described above. These circuits switch on or off transistors at the frequencies according to operating clock signals. Therefore, high frequency noises are emitted by the operation. The composition of the magnetic thin films 41a, 41b is determined according to the frequencies of the noises which are emitted from this control circuit 32. Accordingly, the magnetic thin films 41a, 41b decrease an amount of the high frequency noises which are emitted from the control circuit 32 to the outside. In addition, the magnetic thin films 41a, 41b decrease an amount of electromagnetic waves having the high frequencies which intrude into the signals of the control circuit 32 from the outside.

As described above, the power supply circuit 31 emits low frequency noises according to the operation of the circuit for generating the power supply voltage (a DC-DC converter, for example). The composition of the magnetic thin film 42a, 42b is determined according to frequencies of the noises which are emitted from this power supply circuit 31. Therefore, the magnetic thin films 42a, 42b decrease an amount of the low frequency noises which are emitted from the power supply circuit 31 to the outside. In addition, the magnetic thin films 42a, 42b decrease an amount of electromagnetic waves having the low frequency which intrude into the signals of the power supply circuit 31 from the outside.

Moreover, the electronic device 10 has the high frequency circuit 33, and the semiconductor device 33a and chip component 33b which are included in the high frequency circuit 33 are mounted on the wiring board 11. These semiconductor device 33a and chip component 33b are covered with the magnetic thin films 41a, 41b and the magnetic thin films 42a, 42b.

The magnetic thin films 41a to 42b suppress transmission of electromagnetic waves in frequency bands corresponding to their respective compositions. Therefore, the magnetic thin films 41a to 42b suppress intrusion of the electromagnetic waves (noises) in the frequency bands corresponding to their respective compositions.

The composition of the magnetic thin films 41a, 41b is determined according to the control circuit 32. A frequency band of the imaginary part $\mu''$ in the complex permeability $\mu$ of the magnetic thin films 41a, 41b corresponds to the high frequency noises which are generated in the control circuit 32. Therefore, the magnetic thin films 41a, 41b suppress the high frequency noises which are emitted from the control circuit 32 to the outside and intrude into the high frequency circuit 33.

Likewise, the composition of the magnetic thin films 42a, 42b is determined according to the power supply circuit 31. A frequency band of the imaginary part $\mu''$ in the complex permeability $\mu$ of the magnetic thin films 42a, 42b corresponds to the low frequency noises which are generated in the power supply circuit 31. Therefore, the magnetic thin films 42a, 42b suppress the low frequency noises which are emitted from the power supply circuit 31 to the outside and intrude into the high frequency circuit 33.

As described above, the following advantages can be obtained according to this embodiment.

(1-1) The semiconductor device 31a and the chip component 31b of the power supply circuit 31, and the semiconductor device 32a and the chip component 32b of the control circuit 32 are mounted on the wiring board 11 of the electronic device 10. The surface of the wiring board 11, the surfaces of the semiconductor devices 31a, 32a, and the surfaces of the chip components 31b, 32b are covered with the magnetic film 13a. The magnetic film 13a includes the two magnetic thin films 41a, 41b. The composition of the magnetic thin film 41a (the Ni—Zn ferrite film) is set according to the control circuit 32 and the high frequency circuit 33. The composition of the magnetic thin film 42a (the Mn—Zn ferrite film) is set according to the power supply circuit 31 and the high frequency circuit 33. The magnetic thin film 41a decreases the electromagnetic waves having the frequency according to the control circuit 32. The magnetic thin film 42a decreases the electromagnetic waves having the frequency corresponding to the power supply circuit 31. Moreover, the magnetic thin films 41a, 42a suppress transmission of the electromagnetic waves in the frequency bands corresponding to their respective compositions. Accordingly, the magnetic film 13a including the magnetic thin films 41a, 42a can suppress emission of the electromagnetic waves in the different frequency bands which are generated in the power supply circuit 31 and the control circuit 32.

(1-2) The semiconductor device 33a and the chip component 33b of the high frequency circuit 33 are mounted on the wiring board 11. The surface of the semiconductor device 33a and the surface of the chip component 33b are covered with the magnetic film 13a including the magnetic thin films 41a and 42a. Therefore, the magnetic thin films 41a and 42a can suppress influences of the electromagnetic waves (noises) according to their respective compositions, on the high frequency circuit 33.

(1-3) The wiring board 11 and the electronic components (the semiconductor devices 31a to 33a and the chip components 31b to 33b) are covered with the magnetic film 13a including the magnetic thin films 41a and 42a. The thickness of the magnetic thin films 41a and 42a is 1 to 3 μm. Therefore, it is possible to restrain upsizing of the electronic device 10, as compared with a case where a shield case made of metal or a sheet-like magnetic material is used.

(Modification)

The above described embodiment may be modified in the following manner.

Figure 4:
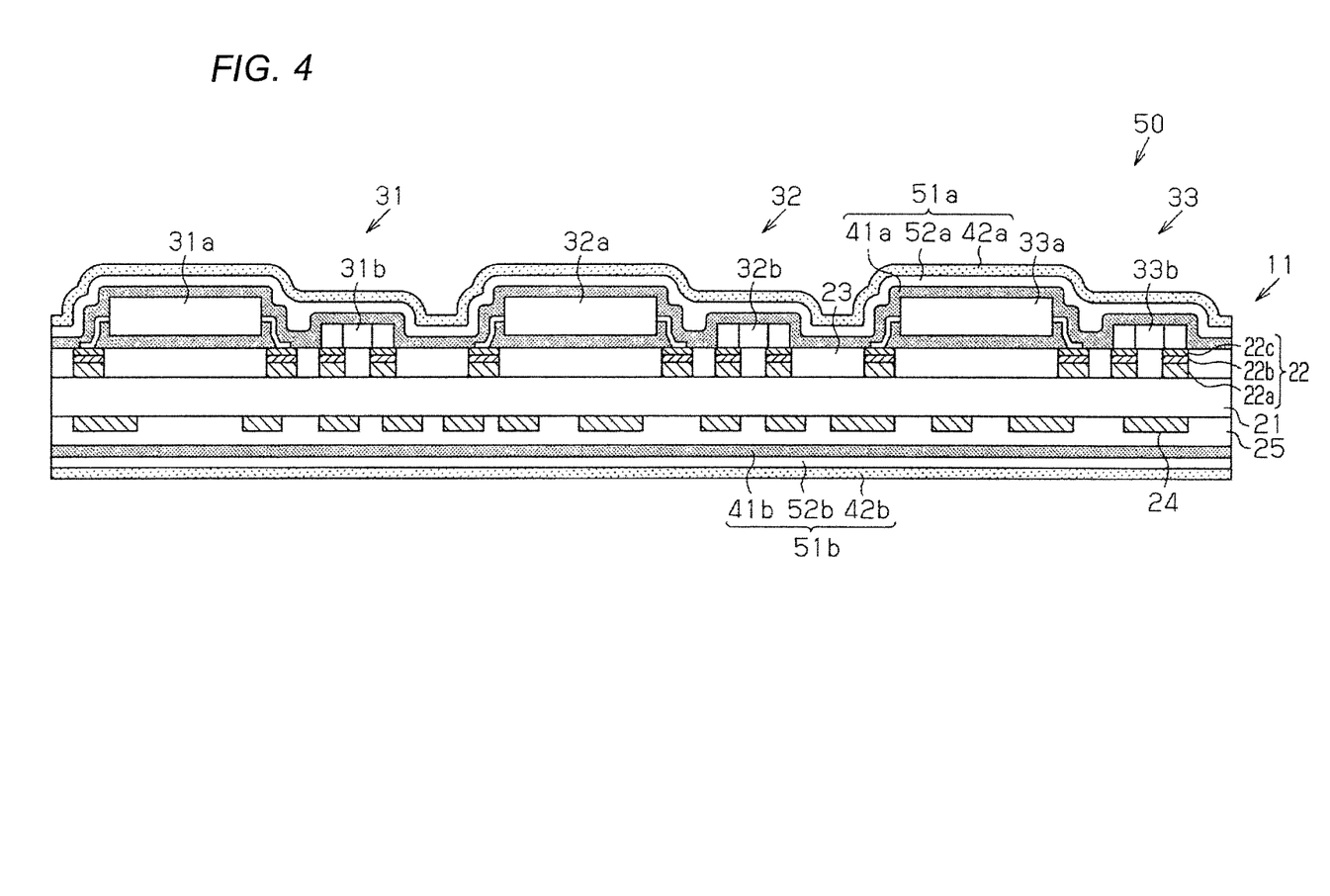
FIG. 4 is a schematic sectional view of an electronic device according to a modification of the first embodiment.

As shown in FIG. 4, a magnetic film 51a of an electronic device 50 includes the magnetic thin films 41a, 42a, and an insulating film 52a. The magnetic thin film 41a, the insulating film 52a, and the magnetic thin film 42a are formed in this order, from the first main face of the wiring board 11 (the face where the electronic components in the respective circuit sections 31 to 33 are mounted) and the surfaces of the electronic components (the semiconductor devices 31a to 33a and the chip components 31b to 33 b).

Likewise, a magnetic film 51b on the second main face of the wiring board 11 (a lower face in FIG. 4, which is a non-mounting face) includes the magnetic thin films 41b, 42b, and an insulating film 52b.

The insulating films 52a, 52b are formed of insulating resin such as epoxy group resin having good adhesion.

A resin such as polyimide group resin may be used as material for the insulating films 52a, 52b. Moreover, as the material for the insulating films 52a, 52b, a sheet-like insulating resin in a B stage (in a half-hardened state) having high viscosity (NCF (Non Conductive Film), for example) or a paste-like insulating resin (NCP (Non Conductive Paste), for example) can be used. It is also possible to use the materials which are different from each other, as the materials for the insulating films 52a, 52b.

The insulating film 52a is formed of the resin having good adhesion. Therefore, it is possible to restrain removal of the magnetic thin films 41a, 42a. Similarly, the insulating film 52b is formed of the resin having good adhesion. Therefore, it is possible to restrain removal of the magnetic thin films 41b, 42b.

Figure 5:
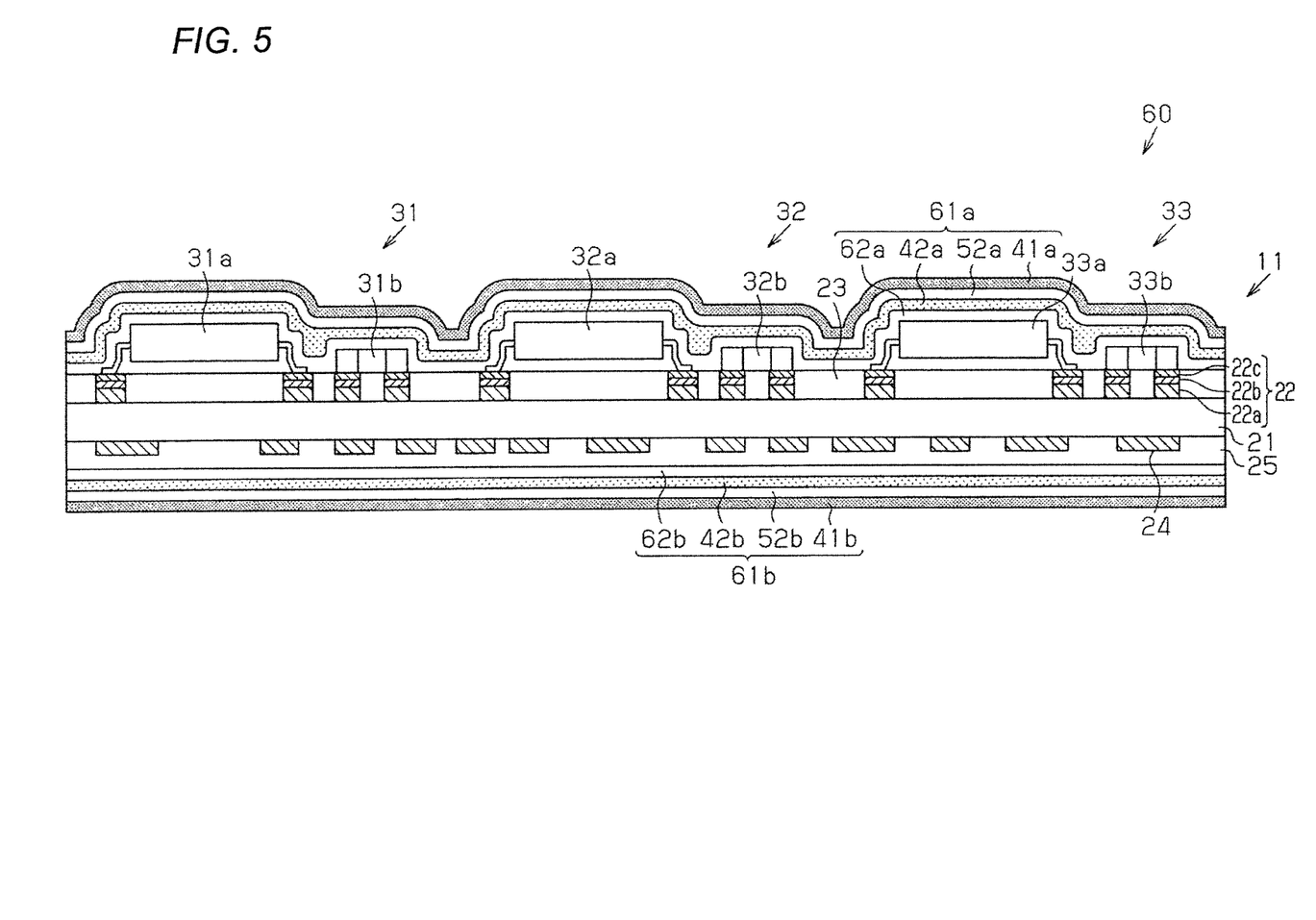
FIG. 5 is a schematic sectional view of an electronic device according to another modification of the first embodiment.

As shown in FIG. 5, a magnetic film 61a of an electronic device 60 includes the magnetic thin films 41a, 42a, and insulating films 52a, 62a. The insulating film 62a, the magnetic thin film 42a, the insulating film 52a, and the magnetic thin film 41a are formed in this order, from the first main face of the wiring board 11 (the face where the electronic components in the circuit sections 31 to 33 are mounted) and the surfaces of the electronic components (the semiconductor devices 31 to 33a and the chip components 31b to 33b).

Likewise, a magnetic film 61b on the second main face of the wiring board 11 (a lower face in FIG. 5, which is a non-mounting face) includes the magnetic thin films 41b, 42b, and insulating films 52b, 62b.

The insulating films 62a, 62b are formed of insulating resin such as epoxy group resin having good adhesion. A resin such as polyimide group resin may be used as material for the insulating films 62a, 62b. Moreover, as the material for the insulating films 62a, 62b, a sheet-like insulating resin in a B stage (in a half-hardened state) having high viscosity (NCF (Non Conductive Film), for example) or a paste-like insulating resin (NCP (Non Conductive Paste), for example) can be used. Moreover, as the material for the insulating films 62a, 62b, Parylene (paraxylene-based polymers) can be used. Parylene can be formed by chemical vapor deposition (CVD) method, for example. By employing Parylene as the material for the insulating films 62a, 62b, it is possible to surely protect the wiring board 11 due to the high electrical insulation property and the mechanical durability of Parylene. Further, since the insulating films 62a, 62b that are formed of Parylene can be formed on the first and second main faces of the wiring board 11 such that the thicknesses of the insulating films 62a, 62b are small and uniform over the wiring board 11, a distance between the magnetic thin film 42a and the power supply circuit 31 or a distance between the magnetic thin film 42a and the high frequency circuit 33 can be made small and kept uniform, which contributes to the improvement in noise reduction. Still further, the insulating films 62a, 62b that are formed of Parylene can be formed to cover the circuits 31 to 33 without any gap therebetween, and thus the insulating films 62a, 62b are never expanded and exploded in a secondary mounting using a reflow furnace.

It is also possible to use materials which are different from each other, as the materials for the insulating films 62a, 62b.

The magnetic thin film 42a is, for example, the Mn—Zn ferrite film. Resistivity of the Mn—Zn ferrite film is lower than resistivity of the Ni—Zn ferrite film (the magnetic thin film 41a). The Ni—Zn ferrite film having the high resistivity can be treated in the same manner as an electric insulator. For this reason, it is possible for the Ni—Zn ferrite film to directly cover the semiconductor devices 31a to 33a and the chip components 31b to 33b, as shown in FIG. 1. On the other hand, in case where the semiconductor devices 31a to 33a and the chip components 31b to 33b are directly covered with the Mn—Zn ferrite film having the low resistivity, bad insulation may be incurred. In this view, the semiconductor devices 31a to 33a and the chip components 31b to 33b are covered with the insulating film 62a, as shown in FIG. 5, and then, the magnetic thin film 42a (the Mn—Zn ferrite film) is formed to cover this insulating film 62a. By covering the surface of the wiring board 11 and the electronic components (the semiconductor devices 31a to 33a and the chip components 31b to 33b) with the insulating film 62a in this manner, restrictions due to the properties of the magnetic thin films 41a, 42a are eliminated, and it is possible to enhance freeness in changing order of working steps for forming the magnetic thin films 41a, 42a.

In FIG. 5, a wiring pattern 24 which is formed on the lower face of the board body 21 is covered with a solder resist 25. Therefore, it is possible to omit the insulating film 62b on the lower face side of the wiring board 11. Moreover, in the magnetic film 61a as shown in FIG. 5, the insulating film 52a between the magnetic thin film 42a and the magnetic thin film 41a may be omitted. In the same manner, in the magnetic film 61b, the insulating film 52b between the magnetic thin film 42b and the magnetic thin film 41b may be omitted.

Second Embodiment

Figure 6:
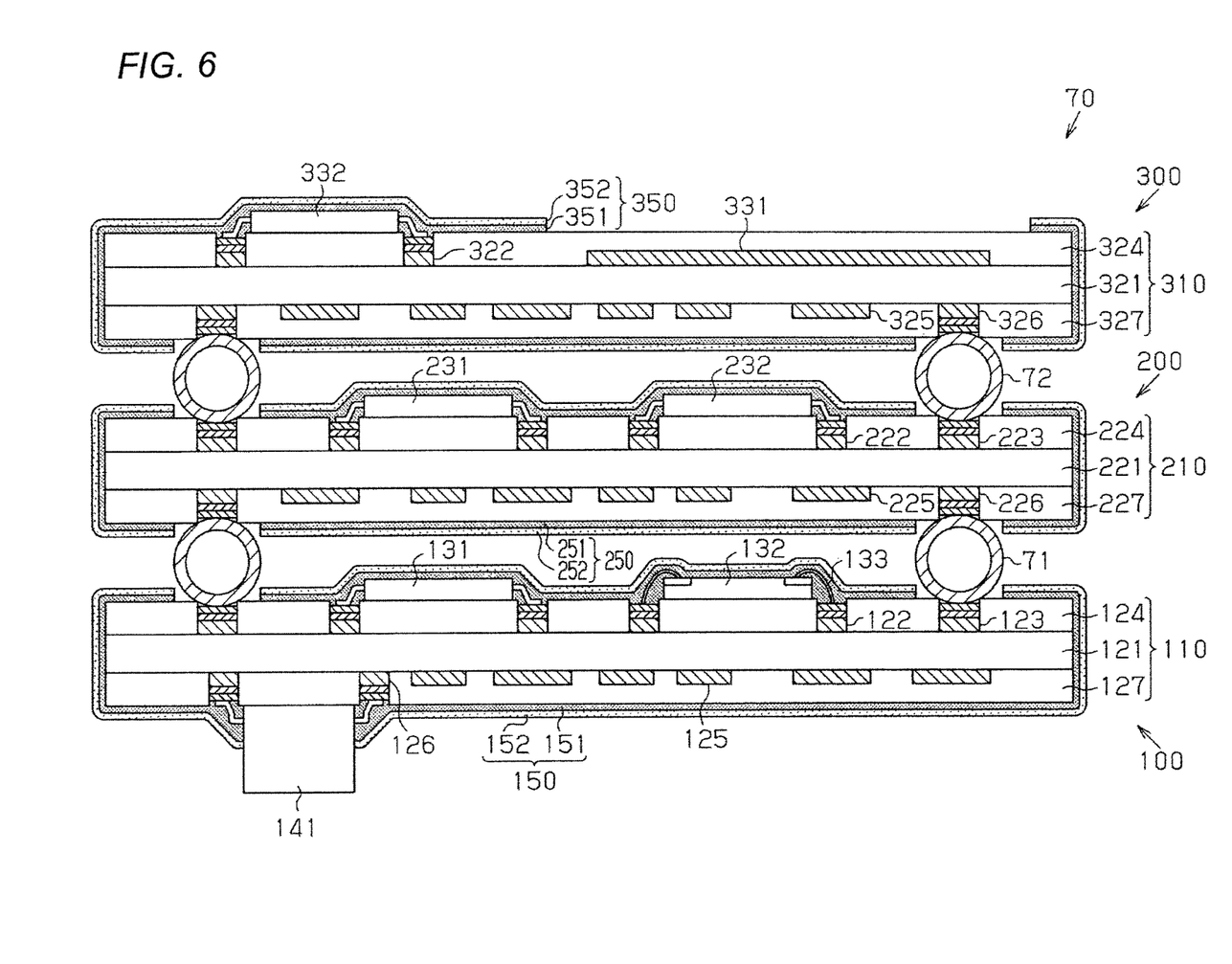
FIG. 6 is a schematic sectional view of an electronic device according to a second embodiment of the present invention.

As shown in FIG. 6, an electronic device 70 has a plurality of (six, in FIG. 6) semiconductor packages 100, 200, 300. The semiconductor package 100 is connected to the semiconductor package 200 by way of solder balls 71, and the semiconductor package 200 is connected to the semiconductor package 300 by way of solder balls 72. The solder balls 71, 72 are one example of connecting members. The solder balls 71, 72 are the solder balls each including a core formed of metal, for example, and this metal is, for example, copper. It is also possible to form each of the solder balls 71, 72 as one including a resin core or one including no core.

A wiring board 110 of the semiconductor package 100 has a board body 121. The board body 121 is made of insulating resin such as glass epoxy resin, ceramics, silicone, or prepreg material. It is also possible to form the board body 121 as a multi-layered wiring board.

Mounting pads 122 and connecting pads 123 are formed on a first main face (an upper face in FIG. 6) of the board body 121. The mounting pads 122 and the connecting pads 123 are formed in the same manner as the mounting pads 22 in the first embodiment, as shown in FIG. 2. Each of the mounting pads 122 and the connecting pads 123 includes a part of a wiring pattern which is exposed from an opening of a solder resist 124, and a plurality of metal layers which are formed on an upper face of the part.

Wiring patterns 125 and mounting pads 126 are formed on a second main face (a lower face in FIG. 6) of the board body 121. The mounting pads 126 are formed in the same manner as the mounting pads 122. Specifically, the mounting pads 126 includes a part of the wiring pattern 125 which is exposed from an opening of a solder resist 127, and a plurality of metal layers which are formed on the part. In FIG. 6, the mounting pads 126 and the wiring patterns 125 are shown as separated from each other. The wiring patterns 125 are electrically connected to the wiring patterns on the upper face of the board body 121 by way of via holes which are not shown. The via holes are through-hole via holes or stack via holes.

A semiconductor device 131 and a secondary battery 132 are mounted on the first main face (the upper face) of the wiring board 110. The semiconductor device 131 is an electronic component included in the power supply circuit, and a representative of the electronic components which are included in the power supply circuit. A package shape of the semiconductor device 131 is, for example, QFP, and leads of the semiconductor device 131 are connected to the mounting pads 122. The secondary battery 132 is connected to the mounting pads 122 by way of wires 133. The power supply circuit controls electric charging of the secondary battery 132. Moreover, the power supply circuit includes a DC-DC converter, for example, and generates power supply voltage to be supplied to the control circuit, the high frequency circuit, and a sensor circuit which will be described below, based on an electric power stored in the secondary battery.

A connecting connector 141 is mounted on the mounting pads 126. The connecting connector 141 is used for transmitting or receiving signals between this electronic device 70 and the other electronic devices, for supplying electric power for charging the secondary battery 132 and so on.

The semiconductor package 100 has a magnetic film 150. The magnetic film 150 is formed to cover a surface of the wiring board 110, a surface of the semiconductor device 131, and a surface of the secondary battery 132, except a region required for connecting the solder balls 71 and the connecting connector 141. The magnetic film 150 includes magnetic thin films 151, 152. The magnetic thin film 151 is, for example, a Ni—Zn ferrite film, and the magnetic thin film 152 is, for example, a Mn—Zn ferrite film. The magnetic thin films 151, 152 are formed, for example, by spin spraying method in the same manner as in the above described embodiment.

A wiring board 210 of the semiconductor package 200 has a board body 221, in the same manner as the wiring board 110 of the semiconductor package 100, and mounting pads 222 and connecting pads 223 are formed on a first main face (an upper face in FIG. 6) of this board body 221. The mounting pads 222 and connecting pads 223 are formed in the same manner as the mounting pads 122 and connecting pads 123 of the wiring board 110. Specifically, each of the mounting pads 222 and the connecting pads 223 includes a part of a wiring pattern which is exposed from an opening of a solder resist 224, and a plurality of metal layers which are formed on an upper face of the part. Wiring patterns 225 and mounting pads 226 are formed on a second main face (a lower face in FIG. 6) of the board body 221. The wiring patterns 225 are formed in the same manner as the wiring patterns 125 of the wiring board 110. The connecting pads 226 are formed in the same manner as the connecting pads 223. Each of the connecting pads 226 includes a part of the wiring pattern which is exposed from an opening of a solder resist 227, and a plurality of metal layers which are formed on the part.

Semiconductor devices 231, 232 are mounted on the first main face (the upper face) of the wiring board 210. The semiconductor devices 231, 232 respectively have leads which are connected to the mounting pads 222 by means of solders (not shown). The semiconductor device 231 is an electronic component included in the control circuit, for example, and a representative of the electronic components included in the control circuit. The semiconductor device 232 is an electronic component included in the high frequency circuit, for example, and a representative of the electronic components included in the high frequency circuit. The control circuit includes, a CPU, and a signal generating circuit for generating clock signals for operating the respective circuit sections, and controls the power supply circuit, high frequency circuit, and sensor circuit. The high frequency circuit includes a receiving circuit and a transmitting circuit for wireless communication, for example.

The semiconductor package 200 has a magnetic film 250. The magnetic film 250 is formed to cover a surface of the wiring board 210, surfaces of the semiconductor devices 231, 232, except regions required for connecting the solder balls 71, 72. The magnetic film 250 includes magnetic thin films 251, 252. The magnetic thin film 251 is, for example, a Ni—Zn ferrite film, and the magnetic thin film 252 is, for example, a Mn—Zn ferrite film.

A wiring board 310 of the semiconductor package 300 has a board body 321, in the same manner as the wiring boards 110, 210, and mounting pads 322 and an electronic component 331 are formed on a first main face (an upper face in FIG. 6) of this board body 321. The electronic component 331 serves as an antenna for wireless communication, for example. The mounting pads 322 are formed in the same manner as the mounting pads 222 of the wiring board 210. Each of the mounting pads 322 includes a part of a wiring pattern (not shown) which is exposed from an opening of a solder resist 324, and a plurality of metal layers which are formed on the part. The electronic component 331 is formed of a wiring pattern, and connected to the semiconductor device 232 in the high frequency circuit of the semiconductor package 200 by way of via holes (not shown), the wiring pattern, the solder ball 72, and so on.

Wiring patterns 325 and connecting pads 326 are formed on a second main face (a lower face in FIG. 6) of the board body 321. The wiring patterns 325 are formed in the same manner as the wiring patterns 225 of the wiring board 210. The connecting pads 326 are formed in the same manner as the connecting pads 226 of the wiring board 210. Specifically, each of the connecting pads 326 includes a part of a wiring pattern which is exposed from an opening of a solder resist 327, and a plurality of metal layers which are formed on the part.

The semiconductor package 300 has a magnetic film 350. The magnetic film 350 is formed to cover a surface of the wiring board 310 and a surface of the semiconductor device 332, except a region required for connecting the solder balls 72 and a region of a solder resist 324 for covering the electronic component 331. The magnetic film 350 includes magnetic thin films 351, 352. The magnetic thin film 351 is, for example, a Ni—Zn ferrite film. The magnetic thin film 352 is, for example, a Mn—Zn ferrite film.

Then, operation of this electronic device 70 will be now described.

The semiconductor packages 100 to 300 which are included in the electronic device 70 have the magnetic films 150, 250, 350 for covering the surfaces of the wiring boards 110, 210, 310, and the semiconductor devices 131, 231, 232, 332. The magnetic films 150, 250, 350 have the magnetic thin films 151, 152, 251, 252, 351, 352 in which the frequency bands of the imaginary part μ" of the complex permeability are determined according to the control circuit, the high frequency circuit, and the power supply circuit. Thus, an amount of high frequency noises, which are generated in the control circuit (the semiconductor device 231) and the high frequency circuit (the semiconductor device 232) and emitted to the outside, is decreased. Moreover, an amount of low frequency noises, which are generated in the power supply circuit (the semiconductor device 131) and emitted to the outside, is decreased. Further, an amount of electromagnetic noises intruding into the respective circuits from the outside is decreased.

The magnetic thin films 151, 152, 251, 252, 351, 352 have a thickness of, for example, 1 to 3 μm, and are tightly adhered to the surfaces of the wiring boards 110 to 310 and the surfaces of the electronic components (the semiconductor devices 131 to 332 and the secondary battery 132). For this reason, it is possible to downsize the electronic device 70, as compared with a case where a shield case formed of metal or a sheet-like magnetic material (a ferrite sheet) is used. For example, in case where the shield case formed of metal or the sheet-like magnetic material is used, it is necessary to set large intervals between the respective semiconductor packages 100 to 300. Accordingly, the sizes and pitches of the solder balls 71, 72 for connecting the semiconductor packages 100 to 300 are made larger. Moreover, because the shield case is fixed to the wiring board, the electronic components cannot be mounted in this region. As a result, arrangement pitches of the solder balls are made larger, which results in upsizing of the electronic device.

As described hereinabove, the following advantages can be obtained according to this embodiment.

(2-1) The semiconductor packages 100 to 300 have the magnetic films 150, 250, 350 for covering the surfaces of the wiring boards 110, 210, 310, and the semiconductor devices 131, 231, 232, 332. The magnetic films 150, 250, 350 include the magnetic thin films 151, 152, 251, 252, 351, 352 in which the frequency bands of the imaginary part μ" of the complex permeability are set according to the control circuit, the high frequency circuit, and the power supply circuit. Thus, it is possible to suppress emission of the high frequency noises, which are generated in the control circuit (the semiconductor device 231) and the high frequency circuit (the semiconductor device 232) and emitted to the outside. Moreover, it is possible to suppress emission of the low frequency noises, which are generated in the power supply circuit (the semiconductor device 131) and emitted to the outside. Further, it is possible to suppress the electromagnetic noises intruding into the respective circuit sections from the outside.

(Modification)

The above described embodiment may be modified in the following manner.

Figure 7:
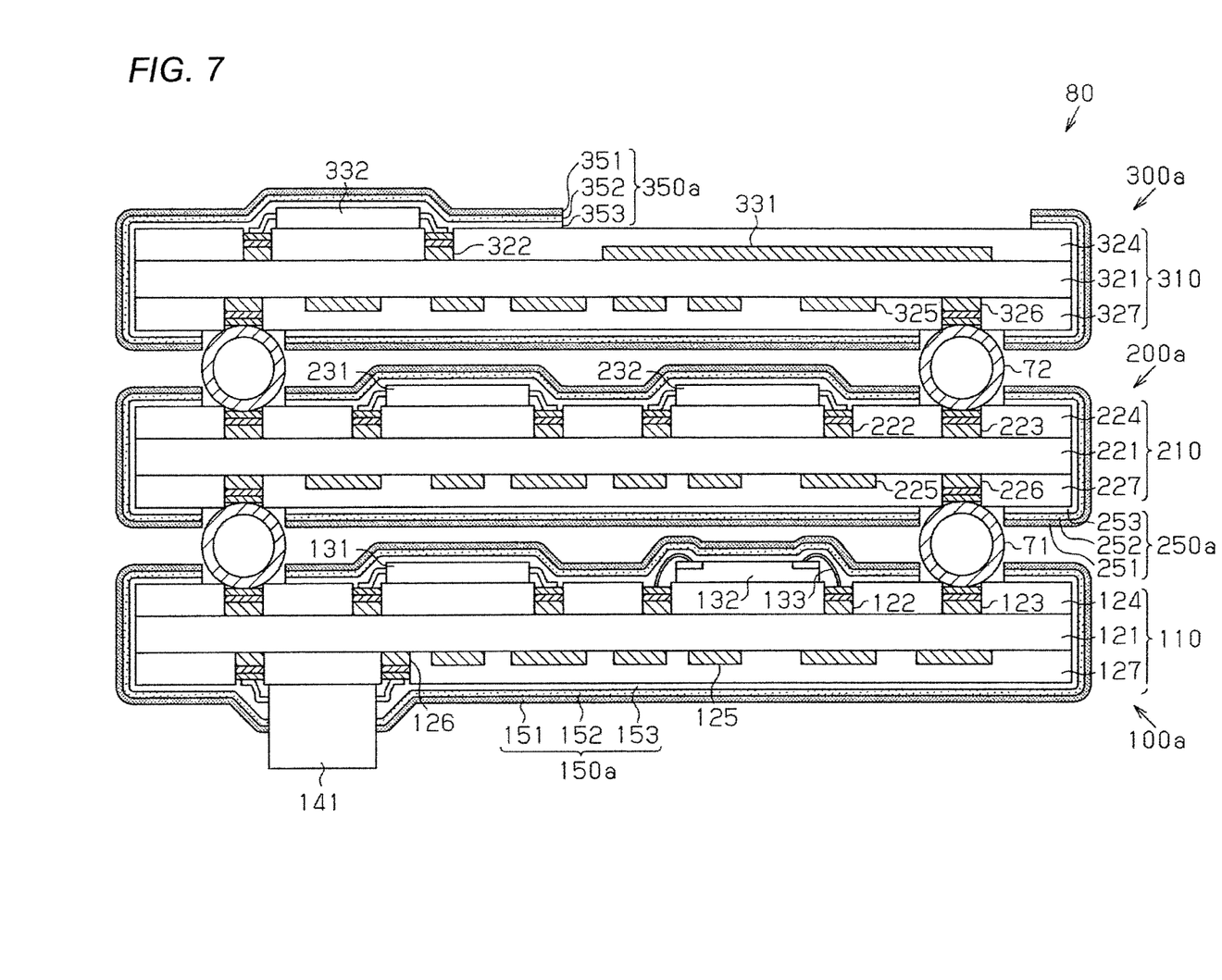
FIG. 7 is a schematic sectional view of an electronic device according to a modification of the second embodiment.

As shown in FIG. 7, an electronic device 80 has semiconductor packages 100a, 200a, 300a. A magnetic film 150a of the semiconductor package 100a includes the magnetic thin films 151, 152, and an insulating film 153. The insulating film 153 and the magnetic thin films 152, 151 are formed in this order from the surface of the wiring board 110. Likewise, a magnetic film 250a of the semiconductor package 200a includes the magnetic thin films 251, 252, and an insulating film 253, and a magnetic film 350a of the semiconductor package 300a includes the magnetic thin films 351, 352, and an insulating film 353. By covering the wiring boards 110 to 310 and so on with the insulating films 150a to 350a in this manner, it is possible to eliminate restrictions due to properties of the magnetic thin films 151, 152 to 351, 352, and to enhance the degree of freedom of manufacturing steps In FIG. 7, an insulating film having high adhesion may be formed between the magnetic thin film 152 and the magnetic thin film 151. Likewise, an insulating film having high adhesion may be formed between the magnetic thin film 252 and the magnetic thin film 251, and between the magnetic thin film 352 and the magnetic thin film 351.

The above described embodiments may be carried out in the following manners.

In the respective embodiments, the number of the magnetic thin films included in the magnetic film may be appropriately changed to three or more.

In the respective embodiments, the number of the magnetic thin films included in the magnetic film on the first main face side (the upper face side in FIG. 2, for example) and the number of the magnetic thin films included in the magnetic film on the second main face side (the lower face side in FIG. 2, for example) may be different from each other. For example, in FIG. 2, the magnetic film on the upper face side may be either of the one including three or more magnetic thin films, the one including two magnetic thin films and one insulating film, and the one including two magnetic thin films and two insulating films.

In the respective embodiments, the order of stacking the magnetic thin films on the first main face side may be different from the order of stacking the magnetic thin films on the second main face side. For example, in the magnetic film 61a as shown in FIG. 5, the insulating film 62a, the magnetic thin film 41a, the insulating film 52a, and the magnetic thin film 42a may be formed in this order from the surfaces of the wiring board 11 and the electronic components.

In the electronic device as shown in FIG. 2, end faces of the wiring board 11 may be covered with the magnetic film. In the same manner, in the electronic device 50 as shown in FIG. 4, and in the electronic device 60 as shown in FIG. 5, end faces of the wiring board 11 may be covered with the magnetic films.

In the electronic device 70 as shown in FIG. 6, resin may be filled between the semiconductor package 100 and the semiconductor package 200. The resin serves to protect connection parts between the semiconductor package 100 and the semiconductor package 200 which are connected by the solder balls 71. Moreover, the resin serves to enhance connecting strength between the semiconductor package 100 and the semiconductor package 200. Also, the resin may be filled between the semiconductor package 200 and the semiconductor package 300.

In FIG. 1B, the electronic component 12f, which serves as the antenna for wireless communication is not covered with the magnetic film 13. The magnetic film 13 includes the magnetic thin films 41a, 42a having different properties from each other, in the same manner as the magnetic film 13a as shown in FIG. 2, for example. Therefore, it is possible to cover the electronic component 12f with the magnetic thin film whose characteristics are set according to such frequency where the electronic component 12f does not receive or transmit signals. For example, in case of the antenna for conducting the wireless communication with the electromagnetic waves of several GHz, the magnetic thin film 42a whose characteristics are set according to the low frequency is formed so as to cover this antenna. In this case, the electromagnetic waves are shielded or attenuated by the magnetic thin film 42a, and the influences of the electromagnetic waves are reduced. Thus, it is possible to reduce influences of noises.

As described above, the preferred embodiment and the modifications are described in detail. However, the present invention is not limited to the above-described embodiment and the modifications, and various modifications and replacements are applied to the above-described embodiment and the modifications without departing from the scope of claims.

What is claimed is:

1. An electronic device comprising:
a wiring board;
a first electronic component which is mounted on the wiring board and emits an electromagnetic wave having a first frequency band;
a second electronic component which is mounted on the wiring board and emits an electromagnetic wave having a second frequency band;
a first magnetic thin film covering the wiring board, the first electronic component and the second electronic component, wherein the first magnetic thin film has a composition corresponding to the first frequency band and is a Mn—Zn ferrite film; and
a second magnetic thin film covering the first magnetic thin film, wherein the second magnetic thin film has a composition corresponding to the second frequency band and is a Ni—Zn ferrite film,
wherein a resonance frequency of the Mn—Zn ferrite film is smaller than that of the Ni—Zn ferrite film,
wherein a resistivity of the first magnetic thin film is larger than that of the second magnetic thin film,
wherein the first frequency band is different from the second frequency band,
wherein the first magnetic thin film shields or attenuates the electromagnetic wave having the first frequency band, and the second magnetic thin film shields or attenuates the electromagnetic wave having the second frequency band.

2. The device of claim 1, further comprising:
a first insulating film directly formed on the wiring board to cover the first electronic component and the second electronic component, wherein the first magnetic thin film and the second magnetic thin film are formed on the first insulating film.

3. The device of claim 1, wherein the first magnetic thin film is directly formed on the wiring board to cover the first electronic component and the second electronic component.

4. The device of claim 2, further comprising:
a second insulating film disposed between the first magnetic thin film and the second magnetic thin film.

5. The device of claim 3, further comprising:
an insulating film disposed between the first magnetic thin film and the second magnetic thin film.

6. The device of claim 1, wherein
a frequency characteristic of an imaginary part of a complex permeability of the first magnetic thin film corresponds to the first frequency band, and
a frequency characteristic of an imaginary part of a complex permeability of the second magnetic thin film corresponds to the second frequency band.

7. The device of claim 1, further comprising:
a third electronic component which is mounted on the wiring board and sends and receives an electromagnetic wave, wherein the third electronic component is exposed from at least one of the first and second magnetic thin films.

* * * * *